(12) United States Patent
Goswami et al.

(10) Patent No.: US 9,099,472 B2
(45) Date of Patent: Aug. 4, 2015

(54) SEMICONDUCTOR CONSTRUCTIONS, METHODS OF FORMING CONDUCTIVE STRUCTURES AND METHODS OF FORMING DRAM CELLS

(71) Applicant: Micron Technology, Inc., Boise, ID (US)

(72) Inventors: Jaydeb Goswami, Boise, ID (US); Hung Ming Tsai, Boise, ID (US); Duane M. Goodner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 14/063,981

(22) Filed: Oct. 25, 2013

(65) Prior Publication Data

US 2014/0048943 A1    Feb. 20, 2014

Related U.S. Application Data

(62) Division of application No. 13/443,141, filed on Apr. 10, 2012, now Pat. No. 8,592,985.

(51) Int. Cl.
| | |
|---|---|
| *H01L 23/532* | (2006.01) |
| *C23C 16/04* | (2006.01) |
| *H01L 27/108* | (2006.01) |
| *H01L 21/74* | (2006.01) |
| *H01L 21/768* | (2006.01) |

(52) U.S. Cl.
CPC ........ *H01L 23/53257* (2013.01); *C23C 16/045* (2013.01); *H01L 21/743* (2013.01); *H01L 27/10876* (2013.01); *H01L 27/10891* (2013.01); *H01L 21/76877* (2013.01); *H01L 2924/0002* (2013.01)

(58) Field of Classification Search
CPC ................... H01L 23/53257; H01L 27/10876; H01L 27/10891; H01L 21/743; C23C 16/045
See application file for complete search history.

(56) References Cited

U.S. PATENT DOCUMENTS

| | | | |
|---|---|---|---|
| 7,029,975 B1 | 4/2006 | Fang et al. | |
| 7,500,208 B2 | 3/2009 | Chen et al. | |
| 7,851,306 B2 | 12/2010 | Fang et al. | |
| 7,968,452 B2 | 6/2011 | Chen et al. | |
| 2010/0102449 A1 | 4/2010 | Ikeda et al. | |
| 2010/0130006 A1* | 5/2010 | Sidhwa | ........................ 438/653 |
| 2011/0188286 A1 | 8/2011 | Yun et al. | |
| 2011/0233778 A1 | 9/2011 | Lee et al. | |

* cited by examiner

*Primary Examiner* — Long Pham
(74) *Attorney, Agent, or Firm* — Wells St. John P.S.

(57) ABSTRACT

Some embodiments include methods of forming conductive structures. An electrically conductive material may be deposited with a first deposition method. The first deposition method has a first deposition rate and forms a first portion of a conductive structure. A second portion of the conductive structure may be formed by depositing the electrically conductive material with a second deposition method having a second deposition rate. The second deposition rate may be different from the first deposition rate by at least about a factor of 3. In some embodiments, a region of the conductive structure is utilized as a transistor gate of a DRAM cell. Some embodiments include semiconductor constructions.

9 Claims, 5 Drawing Sheets

SEMICONDUCTOR CONSTRUCTIONS, METHODS OF FORMING CONDUCTIVE STRUCTURES AND METHODS OF FORMING DRAM CELLS

RELATED PATENT DATA

This patent resulted from a divisional of U.S. patent application Ser. No. 13/443,141, which was filed Apr. 10, 2012, and which is hereby incorporated herein by reference.

TECHNICAL FIELD

Semiconductor constructions, methods of forming conductive structures and methods of forming DRAM cells.

BACKGROUND

There are numerous uses for conductive materials in integrated circuitry. However, it is becoming increasingly difficult to form uniform conductive features with increasing levels of integration due to the shrinking dimensions of the features. It is therefore desired to develop new methods of forming conductive features.

An example conductive feature that may be utilized in integrated circuitry is an access line, such as a wordline. Conventional methodology suitable for fabricating access lines at present dimensions may not be suitable for fabricating the lines at the substantially smaller dimensions of future-generation integrated circuitry. Accordingly, it is desired to develop new methods which may be suitable for fabricating electrically conductive lines having dimensions suitable for incorporation into future generations of highly integrated circuitry.

DETAILED DESCRIPTION OF THE ILLUSTRATED EMBODIMENTS

Some embodiments include methods of forming electrically conductive structures. The structures may comprise a single material which is deposited with at least two different deposition methods. One of the deposition methods may be relatively slow in comparison to another. The slow deposition method may form a desired relatively high-density deposit, but with an associated cost of increased time to form a desired thickness. In contrast, the faster deposition method may form a deposit having a lower density, but with an advantage of a relatively rapid time to form the desired thickness. Some embodiments utilize the combination of the slow deposition method and the fast deposition method to form a conductive component having desired structural properties in a cost-effective manner.

Figure 1:
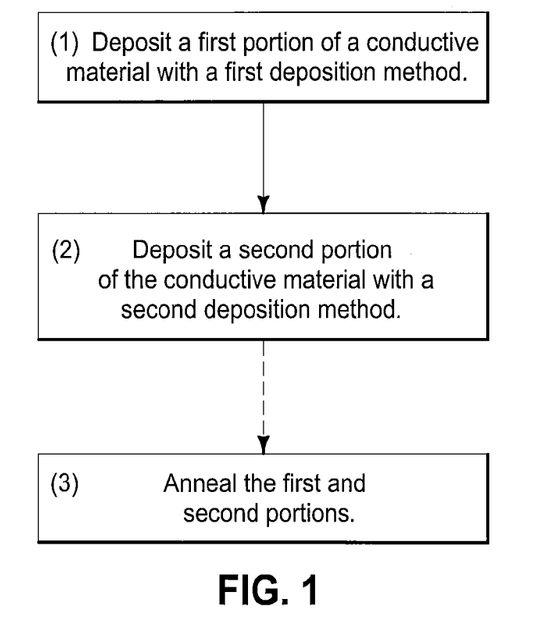
FIG. 1 is a flowchart diagram of an example embodiment method.

FIG. 1 is a flowchart diagram of an example embodiment. In a first step, a first portion of an electrically conductive material is deposited with a first deposition method, and in a second step a second portion of the material is deposited with a second deposition method. The second deposition method may be a different type of deposition method relative to the first deposition method. In some embodiments, the first and second deposition methods may be selected from the group consisting of atomic layer deposition (ALD), chemical vapor deposition (CVD) and cyclic chemical vapor deposition (CCVD). The second deposition method may have a different deposition rate than the first deposition method, and in some embodiments may have a deposition rate which differs from the deposition rate of the first deposition method by at least about a factor of three.

The flowchart of FIG. 1 illustrates an optional third step in which the first and second portions of the conductive material are annealed. Such anneal may comprise heating the first and second portions to a temperature of at least about 950° C., and maintaining the first and second portions at such temperature for at least about 20 seconds. Although the optional anneal is shown to follow the deposition of the second portion of the conductive material; in other embodiments, the anneal may occur after the deposition of the first portion and prior to the deposition of the second portion. Also, although a single optional anneal is illustrated, in other embodiments the anneal may be subdivided amongst two or more different anneals that occur at different process stages. In some embodiments, one of the anneals may follow additional processing; such as, for example, planarization or etch-back. In some embodiments, at least one of the anneals may be a simple thermal anneal, and in some embodiments at least one of the anneals may include plasma treatment utilizing plasma-generated gasses; such as, for example, $N_2$ and/or $NH_3$. If plasma treatment is utilized, it may be conducted at room temperature, or at elevated temperature (such as temperatures up to about 1000° C. in some embodiments).

Figure 3:
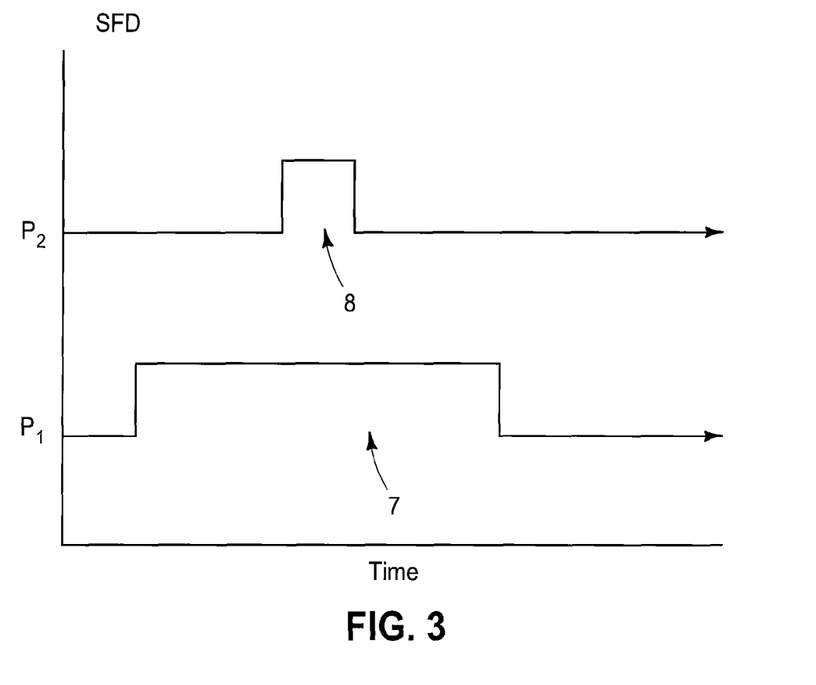
Figure 4:
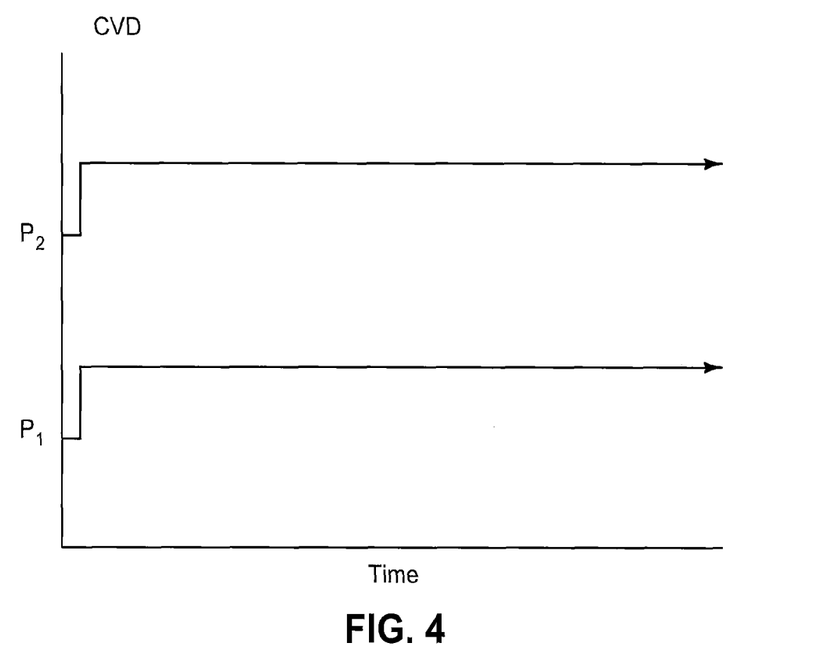

The deposition methods of ALD, CCVD and CVD are described with reference to example pulse sequences in FIGS. 2-4.

Figure 2:
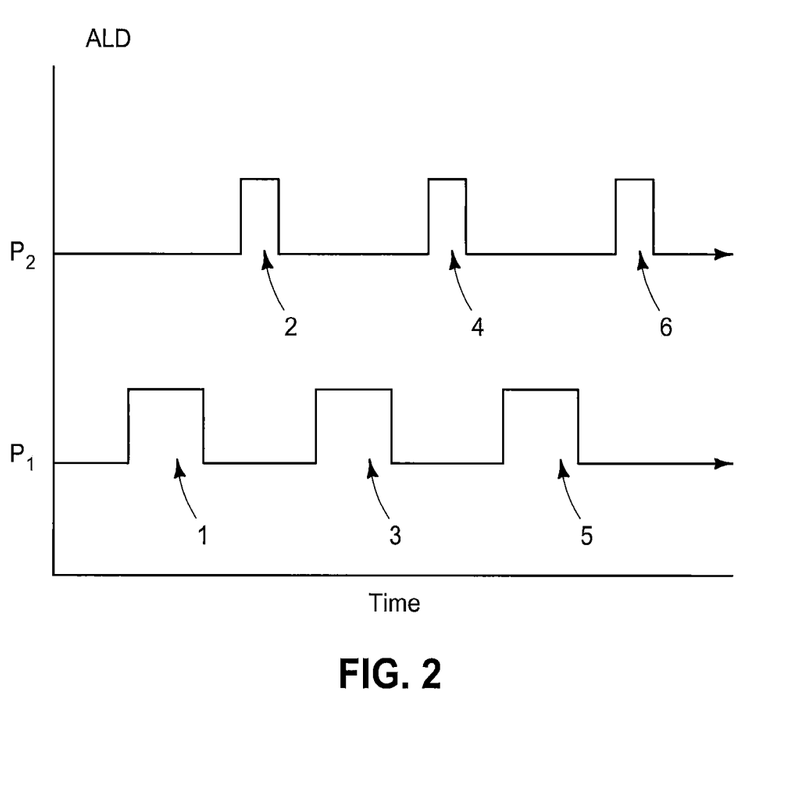
FIGS. 2-4 graphically illustrate pulse schemes of example deposition methods.

FIG. 2 shows an example pulse sequence of an ALD process. A first precursor ($P_1$) is introduced into a reaction chamber at times illustrated by the pulses 1, 3 and 5; and a second precursor ($P_2$) is introduced into the reaction chamber at times illustrated by the pulses 2, 4 and 6. The first and second precursors are not in the reaction chamber at the same time as one another, but instead are flowed into the chamber at sequential and non-overlapping times. In contrast, FIG. 3 shows an example pulse sequence of a CCVD process. The first precursor is introduced into the reaction chamber at a time illustrated by the pulse 7, and the second precursor is introduced into the reaction chamber at a time illustrated by the pulse 8. The first precursor is within a reaction chamber for a period of time during which the second precursor is not in the reaction chamber, but there is also a period of time when both reaction precursors are in the reaction chamber (in some embodiments, it may be the second precursor which is in the reaction chamber during a period of time in the absence of the first precursor, as well as during a period of time overlapping the first precursor). In contrast to both the ALD process and the CCVD process, FIG. 4 shows an example pulse sequence of a CVD process. Neither of the first and second precursors is within the reaction chamber for any substantial time in the absence of the other; and instead the first and second precursors are both within the reaction chamber at the same time as one another, and for the same duration. Although FIGS. 2-4 show two precursors utilized in the pulse schemes, in other embodiments there may be more than two precursors utilized in one or more of the pulse schemes.

The method described above with reference to FIG. 1 may be utilized for forming numerous conductive structures. In some embodiments, the method may be used to form one or more conductive structures across planar surfaces. In some embodiments, the method may be used to form one or more conductive structures within openings. FIGS. 5-11 illustrate an example embodiment in which the method is utilized to form a conductive structure within an opening.

Figure 5:
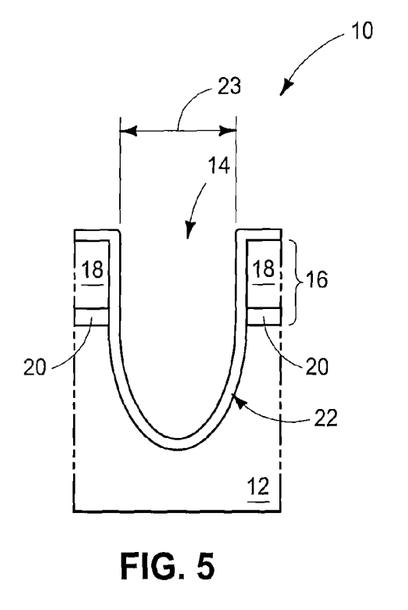
FIGS. 5-11 are diagrammatic cross-sectional views of a portion of a semiconductor construction at various process stages of an example embodiment method.

Referring to FIG. 5, a construction 10 comprises a supporting material 12 having an opening 14 formed therein. In some embodiments, the supporting material may be a semiconductor material, such as, for example, monocrystalline silicon. In some embodiments, the supporting material may be considered to be comprised by a base. Such base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Thus, supporting material 12 may be comprised by a semiconductor substrate containing one or more materials associated with integrated circuit fabrication in some embodiments. Some of the materials may be under the shown region of the supporting material and/or may be laterally adjacent the shown region of the supporting material; and may correspond to, for example, one or more of refractory metal materials, barrier materials, diffusion materials, insulator materials, etc.

In some embodiments, the opening 14 may correspond to a trench extending in and out of the page relative to the cross-sectional view of FIG. 5.

In the shown embodiment, a patterned mask 16 is over supporting material 12, and defines a location of opening 14. The illustrated patterned mask comprises silicon nitride 18 over a pad of silicon dioxide 20. Other patterned masks may be utilized in other embodiments, and in yet other embodiments the patterned mask may be omitted from a processing stage analogous to that of FIG. 5.

A liner 22 extends within opening 14. A portion of the liner directly against material 12 may correspond to silicon dioxide; and in some embodiments may be silicon dioxide which is thermally grown from a silicon-containing surface along a periphery of opening 14. Although the illustrated liner extends along mask 16, in other embodiments the liner may not extend along such mask. Also, although the liner is shown to have a uniform thickness along the mask and along supporting material 12, in other embodiments the liner may have a different thickness along one or both of materials 18 and 20 relative to the thickness along supporting material 12. In embodiments in which the liner is formed along supporting material 12 by thermally growing silicon dioxide from an exposed silicon-containing surface of material 12, the region of the liner along silicon nitride 18 may correspond to silicon oxynitride generated by the conditions utilized to grow the silicon oxide. The liner may comprise any suitable material. Although the liner is described as comprising silicon dioxide, in other embodiments the liner may comprise other materials, either in addition to, or alternatively to, the silicon dioxide; and may or may not be thermally grown.

The illustrated lined opening 14 has a maximum width 23 along the cross-section of FIG. 5. In some embodiments, the methods provided herein for depositing electrically conductive materials may be particularly advantageous for forming materials within narrow openings associated with highly-integrated circuitry. For instance, the width 23 may be less than or equal to about 30 nanometers in some embodiments; and may be less than or equal to about 20 nanometers in some embodiments.

Figure 6:
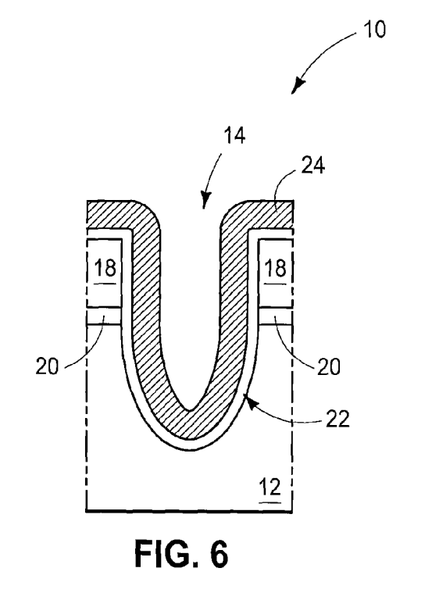

Referring to FIG. 6, a conductive material 24 is formed within opening 14 utilizing a first deposition method. The first deposition method may be any suitable method, and in some embodiments may be selected from the group consisting of ALD, CVD and CCVD. The first deposition method may be utilized to form a first portion of material 24 to any suitable thickness. In some embodiments, the first deposition method may be ALD or CCVD, and may be utilized to form a film of material 24 having a thickness of less than or equal to about 5 nanometers.

In some embodiments, the electrically conductive material 24 may comprise, consist essentially of or consist of a material selected from the group consisting of titanium nitride, ruthenium, ruthenium oxide, iridium, iridium oxide, rhenium and rhenium oxide. In some embodiments, the electrically conductive material 24 is incorporated into a transistor gate. In such embodiments, the electrically conductive material 24 may comprise, consist essentially of, or consist of any of the above-listed materials; but it may be particularly advantageous for the conductive material to comprise, consist essentially of, or consist of titanium nitride.

Figure 7:
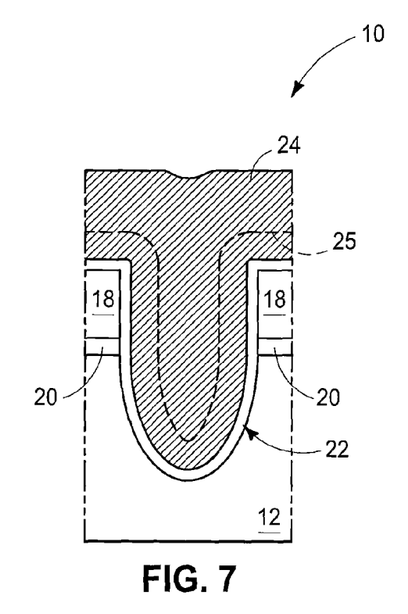

Referring to FIG. 7, additional conductive material 24 is formed with a second deposition method. The second deposition method is a different type of deposition method than the first deposition method. Any suitable deposition method may be utilized. In some embodiments, both the first and second deposition methods may be selected from the group consisting of ALD, CVD and CCVD. For instance, the deposition method utilized to form the first portion of material 24 at the processing stage of FIG. 6 may be ALD or CCVD, and the deposition method utilized to form the second portion of material 24 at the processing stage of FIG. 7 may be CVD. In other embodiments, the first portion may be formed with ALD and the second portion formed with CCVD; the first portion formed with CVD and the second portion formed with ALD; etc. The second portion of material 24 may be formed to any suitable thickness, and in some embodiments may be formed to a thickness of at least about 35 nanometers.

A dashed line 25 is provided in FIG. 7 to diagrammatically illustrate a boundary between the first portion of material 24 formed at the processing stage of FIG. 6, and the second portion of material 24 formed at the processing stage of FIG. 7. In some embodiments, the first and second portions may be substantially identical to one another in physical properties so that the portions completely merge at the processing stage of FIG. 7. In other embodiments, the first and second portions may differ in one or more physical properties so that dashed line 25 represents an actual boundary that exists between the first portion of material 24 and the subsequently-deposited second portion. For instance, in some embodiments the first portion of material 24 may be a relatively high-density portion deposited by a relatively slow deposition method (for instance, ALD or CCVD) and the second portion of material 24 may be a relatively low-density portion deposited by a relatively fast deposition method (for instance, CVD). The terms "relatively high-density" and "relatively low-density" are utilized for comparison to one another. According, the relatively high-density portion has a higher density than the relatively low-density portion. Similarly, the terms "relatively fast deposition method" and "relatively slow deposition method" are utilized for comparison to one another. In some embodiments, the relatively fast deposition method may have a deposition rate which is at least about three times faster than the relatively slow deposition method. In some embodiments, the relatively low-density portion and relatively high-density portion may differ in density from one another by at least a factor of about 1.25.

Figures 8, 9, 10:
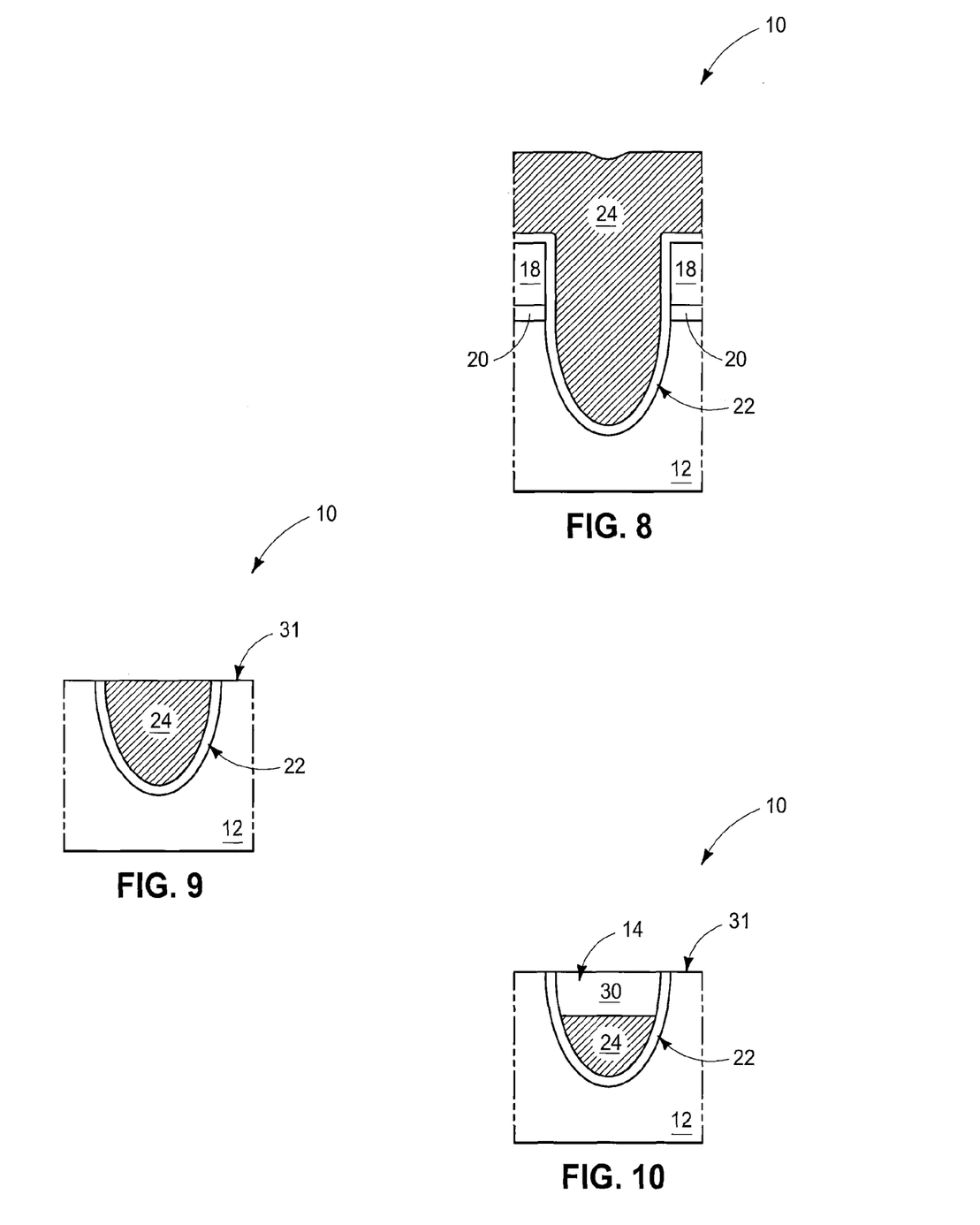

Referring to FIG. 8, construction 10 is illustrated after annealing material 24 to increase density throughout material 24. In the shown embodiment, such has removed any physical difference between the first and second portions of the material 24, and accordingly the dashed line 25 (FIG. 7) has been removed. The anneal may comprise any suitable conditions for treating the material 24. In some embodiments, the material 24 comprising titanium nitride and the anneal may comprise maintaining material 24 at a temperature of at least about 1050° C. for any suitable duration. In some embodiments, the anneal may be conducted at a temperature within a range of from about 950° C. to about 1050° C. for a time of from slightly greater than 0 seconds (i.e., a thermal spike) to a time of at least about 30 seconds. In some embodiments, the anneal may comprise a plasma treatment at any suitable temperature; such as, for example, a temperature of greater than or equal to about room temperature (i.e., about 20° C.). As discussed above with reference to FIG. 1, the anneal may comprise multiple treatments in some embodiments, or may be optional in some embodiments.

Referring to FIG. 9, construction 10 has been subjected to planarization (for instance, chemical-mechanical polishing) to remove masking materials 18 and 20 (FIG. 8) and form a planarized surface 31 extending across material 12, liner 22, and material 24.

Referring to FIG. 10, electrically conductive material 24 is recessed within opening 14, electrically insulative material 30 is formed over the recessed conductive material, and the planarized surface 31 is reestablished across materials 12 and 30.

Material 24 may be recessed utilizing any suitable method, including, for example, one or more chemical and/or physical etches.

Electrically insulative material 30 may comprise any suitable composition or combination of compositions; and in some embodiments may comprise silicon dioxide and/or silicon nitride. The material 30 may comprise a same composition as liner 22 in some embodiments, and may be a different composition relative to liner 22 in other embodiments.

As discussed above with reference to FIG. 2, opening 14 may be a trench extending in and out of the page relative to the cross-sectional views provided herein. In such embodiments, conductive material 24 may be a line extending in and out of the page along an interior region of such trench. The line of conductive material 24 may be an access line (for instance, a wordline) in some embodiments. The region of material 24 shown in FIG. 10 may ultimately be utilized as a transistor gate (as discussed below with reference to FIG. 11), and in such embodiments material 24 may be referred to as gate material. The region of liner 22 along such gate material may be referred to as gate dielectric material.

Figure 11:
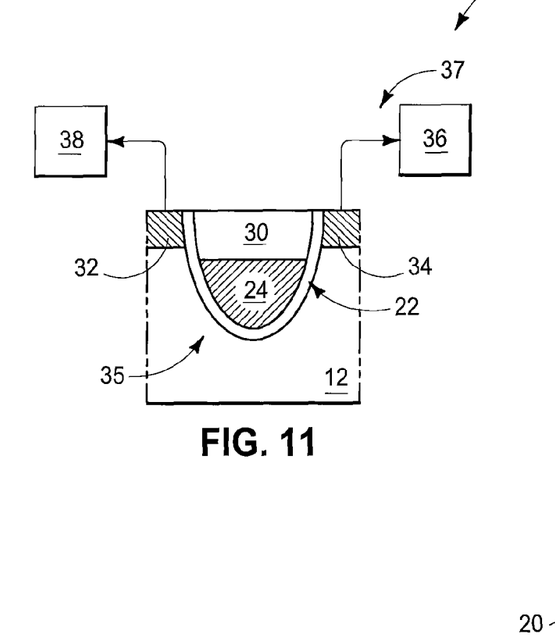

Referring to FIG. 11, source/drain regions 32 and 34 are formed within material 12 and on opposing sides of gate material 24 relative to one another. In some embodiments, material 12 comprises semiconductor material, and the source/drain regions may be formed by implanting one or more suitable conductivity-enhancing dopants into such semiconductor material. The gate 24, gate dielectric of liner 22, and the source/drain regions 32 and 34, together form a transistor 35. Although the source/drain regions are shown formed after gate material 24, in other embodiments the source/drain regions may be implanted at other processing stages; including, for example, processing stages prior to deposition of the material 24.

Source/drain region 34 is electrically connected to a charge storage device 36 (such as a capacitor), and thus transistor 35 is incorporated into a DRAM cell 37. Such DRAM cell may be representative of a large number of cells formed within a DRAM array. Source/drain region 32 is illustrated to be electrically connected to data/sense line 38, such as a bitline. The illustrated DRAM cell 37 may be uniquely addressed in a memory array utilizing the bitline 38 in combination of a wordline comprising gate material 24.

In the example embodiment of FIGS. 5-11, the anneal of material 24 (described with reference to FIG. 8) occurred prior to formation of source/drain regions 32 and 34. In other embodiments, such anneal may be conducted after formation of the source/drain regions and may be part of an anneal utilized to activate dopant within such source/drain regions.

Figure 12:
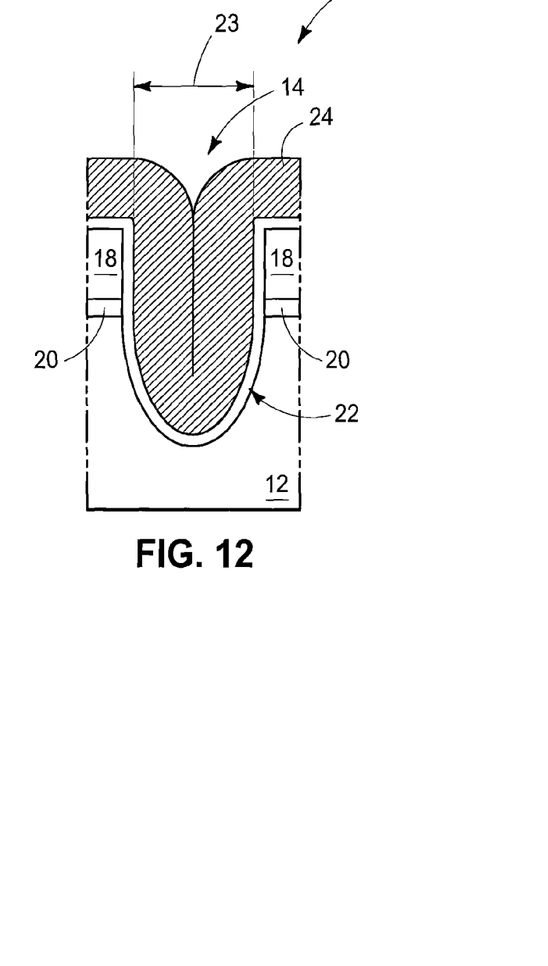
FIGS. 12 and 13 are diagrammatic cross-sectional views of a portion of a semiconductor construction at process stages of another example embodiment method.

The example embodiment described with reference to FIGS. 5-11 forms the first portion of material 24 (shown in FIG. 6) to have a thickness substantially less than one-half of the width 23 of the illustrated opening, and thus the first portion of the material lines a periphery of the opening In some embodiments, the first portion of material 24 may be formed to a greater thickness than that shown in FIG. 6, and may close off a bottom region of the opening. For instance, FIG. 12 shows a construction 10a at a processing stage analogous to that of FIG. 6 in accordance with an embodiment in which the first portion of material 24 is formed to be thick enough to close off a bottom of opening 14. Specifically, a segment of material 24 along one side of opening 14 merges with a segment of material 24 along an opposing side of opening 14.

Figure 13:
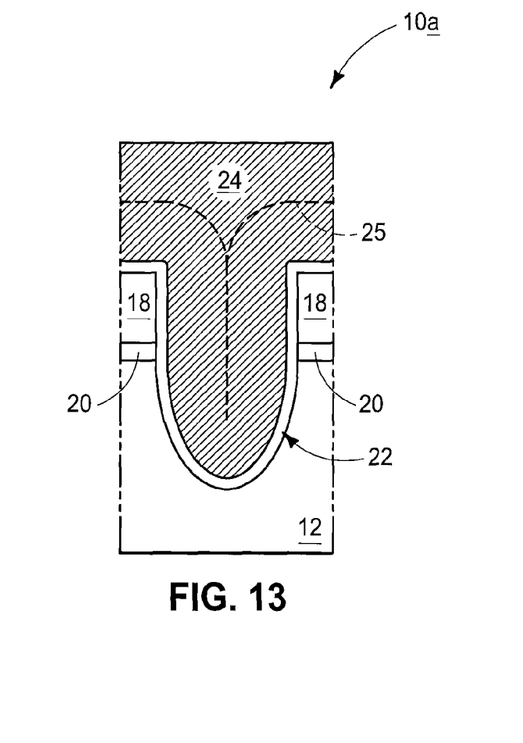

FIG. 13 shows construction 10a at a processing stage analogous to that of FIG. 7, and shows the second portion of material 24 formed across the first portion, with the dashed line 25 be utilized to illustrate an approximate boundary between the first and second portions. In subsequent processing, construction 10a of FIG. 13 may be utilized to form a DRAM cell analogous to the cell 37 described above with reference to FIG. 11. Although the second portion of material 24 does not appear to extend very far into opening 14 in the shown embodiment, the second portion may extend far enough between the merged segments of the first portion to ultimately be incorporated into a line or other component patterned from material 24.

In some embodiments, methods described herein may be utilized to form narrow conductive structures suitable for utilization in highly-integrated circuitry. For instance, the gate 24 of FIG. 11 may have a maximum width along the cross-section section of FIG. 11 of less than 30 nanometers in some embodiments, and even less than 20 nanometers in some embodiments. In some embodiments, it is desired to utilize titanium nitride as gate material. It is difficult to utilize titanium nitride alone as a gate material when the titanium nitride is formed by conventional methods, and accordingly the titanium nitride is commonly utilized in combination with other conductive materials, such as tungsten. However, the narrow gates described herein may be too small to be suitable for fabrication as two different materials (for instance, it may be difficult, or even impossible, to uniformly fill openings of the type shown in FIG. 5 with two different materials when the openings have maximum widths less than 40 nanometers). Prior art problems associated with the utilization of titanium nitride alone as gate material may include large columnar grains within the titanium nitride, high stress between the titanium nitride and adjacent the gate dielectric, and warping (i.e. bending) of lines comprising the titanium nitride—possibly due to the high stress and/or columnar grains. In some embodiments, methods described herein may enable titanium nitride to be formed in a manner which alleviates or eliminates such prior art problems. Some embodiments may thus enable formation of gatelines suitable for utilization in highly integrated circuitry, with such gatelines consisting solely of titanium nitride.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming a conductive structure. A first portion of the conductive structure is formed by depositing an electrically conductive material with a first deposition method. The first deposition method has a first deposition rate. A second portion of the conductive structure is formed by depositing the electrically conductive material with a second deposition method. The second deposition method has a second deposition rate. The second deposition rate is different from the first deposition rate by at least about a factor of 3. The electrically conductive material is selected from the group consisting of titanium nitride, ruthenium, ruthenium oxide, iridium, iridium oxide, rhenium and rhenium oxide.

In some embodiments, the invention includes a method of forming a conductive structure. An opening is formed in a supporting material. A first portion of the conductive structure is formed within the opening by depositing an electrically conductive material within the opening utilizing a first deposition method. A second portion of the conductive structure is formed over the first portion by depositing the electrically conductive material with a second deposition method. The second deposition method is a different type of deposition method relative to the first deposition method. The electrically conductive material is selected from the group consisting of titanium nitride, ruthenium, ruthenium oxide, iridium, iridium oxide, rhenium and rhenium oxide.

In some embodiments, the invention includes a method of forming a DRAM cell. An opening is formed in a semiconductor material, and the opening is lined with gate dielectric material. A first portion of an electrically conductive gate is formed within the opening by depositing an electrically conductive material within the opening utilizing a first deposition method. The first deposition method has a first deposition rate. A second portion of the gate is formed over the first portion by depositing the electrically conductive material with a second deposition method. The second deposition method has a second deposition rate. The second deposition method is a different type of deposition method relative to the first deposition method. The second deposition rate is different from the first deposition rate by at least about a factor of 3. The electrically conductive material is selected from the group consisting of titanium nitride, ruthenium, ruthenium oxide, iridium, iridium oxide, rhenium and rhenium oxide. The first and second portions are annealed at a temperature of at least about 950° C. for a time of at least about 20 seconds. A pair of source/drain regions is formed within the semiconductor material. The source/drain regions are on opposing sides of the semiconductor material from one another. A charge-storage device is formed to be electrically coupled with one of the source/drain regions.

Some embodiments include a semiconductor construction comprising a conductive structure having a first portion directly against a second portion. The first and second portions are a same composition material as one another but differ from one another in density In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction comprising a conductive structure having a first portion directly against a second portion; with the first and second portions being a same composition material as one another but differing from one another in density; wherein the first and second portions both extend into an opening in a semiconductor substrate; and wherein the second portion has a higher density than the first portion and is over the first portion.

2. The construction of claim 1 wherein the first and second portions differ in density from one another by at least about a factor of about 1.25.

3. The construction of claim 1 wherein the material is selected from the group consisting of titanium nitride, ruthenium, ruthenium oxide, iridium, iridium oxide, rhenium and rhenium oxide.

4. A semiconductor construction comprising a conductive structure having a first portion directly against a second portion; with the first and second portions being a same composition material as one another but differing from one another in density; wherein the first and second portions both extend into an opening in a semiconductor substrate; and wherein the first portion has a higher density than the second portion and is under the second portion.

5. A semiconductor construction comprising a conductive structure having a first portion directly against a second portion; with the first and second portions being a same composition material as one another but differing from one another in density; wherein the first and second portions both extend into an opening in a semiconductor substrate; and wherein the second portion has a higher density than the first portion and is over the first portion; wherein the first and second portions differ in density from one another by at least about a factor of about 1.25; and wherein the material is selected from the group consisting of ruthenium, ruthenium oxide, rhenium and rhenium oxide.

6. The construction of claim 1 wherein the material consists of titanium nitride.

7. The construction of claim 4 wherein the first and second portions differ in density from one another by at least about a factor of about 1.25.

8. The construction of claim 4 wherein the material is selected from the group consisting of titanium nitride, ruthenium, ruthenium oxide, iridium, iridium oxide, rhenium and rhenium oxide.

9. The construction of claim 4 wherein the material consists of titanium nitride.

* * * * *